(12) United States Patent
Tadokoro et al.

(10) Patent No.: US 12,716,967 B2
(45) Date of Patent: Aug. 25, 2026

(54) DYNAMICAL LIQUID SENSORS

(71) Applicant: Toyota Motor Engineering & Manufacturing North America, Inc., Plano, TX (US)

(72) Inventors: Yukihiro Tadokoro, Ann Arbor, MI (US); Taewha Lee, Ann Arbor, MI (US); Ziqi Yu, Ann Arbor, MI (US); Xiaopeng Li, Ann Arbor, MI (US); Taishi Kimura, Chicago, IL (US)

(73) Assignees: Toyota Motor Engineering & Manufacturing North America, Inc, Plano, TX (US); Toyota Jidosha Kabushiki Kaisha, Toyota Aichi-ken (JP)

( * ) Notice: Subject to any disclaimer, the term of this patent is extended or adjusted under 35 U.S.C. 154(b) by 147 days.

(21) Appl. No.: 18/491,126

(22) Filed: Oct. 20, 2023

(65) Prior Publication Data

US 2025/0130296 A1 Apr. 24, 2025

(51) Int. Cl.

| | |
|---|---|
| ***G01R 33/32*** | (2006.01) |
| ***G01N 21/64*** | (2006.01) |
| ***G01R 33/032*** | (2006.01) |
| ***G01R 33/12*** | (2006.01) |

(52) U.S. Cl.

CPC ....... *G01R 33/032* (2013.01); *G01N 21/6489* (2013.01); *G01R 33/1276* (2013.01)

(58) Field of Classification Search

CPC ........ G02B 6/32; G02B 6/4202; G01R 33/26; G01R 33/0005; G01R 33/0017; G01R 33/032; G01R 33/0354

See application file for complete search history.

(56) References Cited

U.S. PATENT DOCUMENTS

| | | | |
|---|---|---|---|
| 9,823,313 | B2 | 11/2017 | Hahn et al. |
| 9,829,545 | B2 | 11/2017 | Stetson et al. |
| 10,107,874 | B2 | 10/2018 | Kelezko et al. |

(Continued)

FOREIGN PATENT DOCUMENTS

| | | | | | |
|---|---|---|---|---|---|
| CN | 113804941 | A | | 8/2022 | |
| KR | 20200111020 | A | * | 9/2020 | ........... H10D 62/118 |
| KR | 20230041540 | A | | 3/2023 | |

OTHER PUBLICATIONS

Hollendonner, et al. "Quantum sensing of electric field distributions of liquid electrolytes with NV-centers in nanodiamonds", arXiv preprint arXiv:2301.04427 (2023).

(Continued)

*Primary Examiner* — Lee E Rodak
*Assistant Examiner* — Taqi R Nasir
(74) *Attorney, Agent, or Firm* — Christopher G. Darrow; Darrow Mustafa PC

(57) ABSTRACT

A sensor includes a tweezer source configured to manipulate a defect nanoparticle in a liquid to a desired position in an enclosure containing the liquid and a light source configured to optically excite the defect nanoparticle in the liquid at the desired position. The sensor also includes a radio frequency (RF) excitation source configured to RF excite the defect nanoparticle in the liquid at the desired position and an optical detector configured to receive an optical signal emitted from the optically excited defect nanoparticle.

20 Claims, 4 Drawing Sheets

(56) References Cited

U.S. PATENT DOCUMENTS

| | | | | |
|---|---|---|---|---|
| 2011/0062957 | A1* | 3/2011 | Fu | G01N 24/088 324/307 |
| 2017/0370979 | A1* | 12/2017 | Braje | G01R 29/0885 |
| 2020/0334559 | A1* | 10/2020 | Anderson | G06N 20/00 |

OTHER PUBLICATIONS

Acosta, et al. "Temperature dependence of the nitrogen-vacancy magnetic resonance in diamond." Physical review letters 104.7 (2010): 070801.
Dolde, et al. "Electric-field sensing using single diamond spins", Nature Physics 7.6 (2011): 459-463.
Feng, et al. "Recent applications of fluorescent nanodiamonds containing nitrogenvacancy centers in biosensing", Functional Diamond 2.1 (2022): 192-203.
Ozcelik, et al. "Acoustic tweezers for the life sciences." Nat Methods 15, 1021-1028 (2018).

* cited by examiner

DYNAMICAL LIQUID SENSORS

TECHNICAL FIELD

The present disclosure relates to sensors and particularly to sensors in liquids.

BACKGROUND

Monitoring a property, state, and/or status of a liquid can be important for the desired operation of machines and devices such as motor vehicles, power generators, and batteries, among others. And the property, state, and/or status of such a liquid is typically determined with one or more probes or electrodes. However, a probe and/or electrode can result in or cause unexpected changes of the property, state, and/or status of the liquid located adjacent to or near the probe and/or electrode. In addition, probes and electrodes typically measure a property, state, and/or status of a liquid at a fixed and specific location, which can lead to or result in poor sensitivity and spatial resolution of the measured property.

The present disclosure addresses issues related to measuring properties of liquids and improving such measurements.

SUMMARY

This section provides a general summary of the disclosure and is not a comprehensive disclosure of its full scope or all of its features.

In one form of the present disclosure, a sensor includes a tweezer source configured to manipulate a defect nanoparticle in a liquid to a desired position in an enclosure containing the liquid, and a light source configured to optically excite the defect nanoparticle in the liquid at the desired position. The sensor also includes a radio frequency (RF) excitation source configured to RF excite the defect nanoparticle in the liquid at the desired position and an optical detector configured to receive an optical signal emitted from the optically excited defect nanoparticle.

In another form of the present disclosure, a sensor includes an enclosure containing a liquid, a tweezer source configured to manipulate a defect nanoparticle in the liquid to a desired position in the enclosure, a light source configured to optically excite the defect nanoparticle in the liquid at the desired position, and an RF excitation source configured to RF excite the defect nanoparticle in the liquid at the desired position at a range of RF frequencies. The sensor also includes an optical detector configured to receive an optical signal emitted from the optically excited defect nanoparticle, and a controller configured to determine a property of the liquid as a function of the optical signal.

In still another form of the present disclosure, a method includes manipulating a defect nanoparticle in a liquid with a tweezer source such that the defect nanoparticle is located at a desired position in an enclosure containing the liquid, and optically exciting, with a light source, the defect nanoparticle in the liquid at the desired position. The method also includes RF exciting, with an RF source, the defect nanoparticle in the liquid at the desired position with a range of RF frequencies, detecting an optical signal, with an optical detector, from the optically excited defect nanoparticle as a function of the range of RF frequencies, and determining, with a controller, a property of the liquid as a function of the detected optical signal.

Further areas of applicability and various methods of enhancing the disclosed technology will become apparent from the description provided herein. The description and specific examples in this summary are intended for illustration only and are not intended to limit the scope of the present disclosure.

BRIEF DESCRIPTION OF THE DRAWINGS

The present teachings will become more fully understood from the detailed description and the accompanying drawings, wherein.

Figure 1:
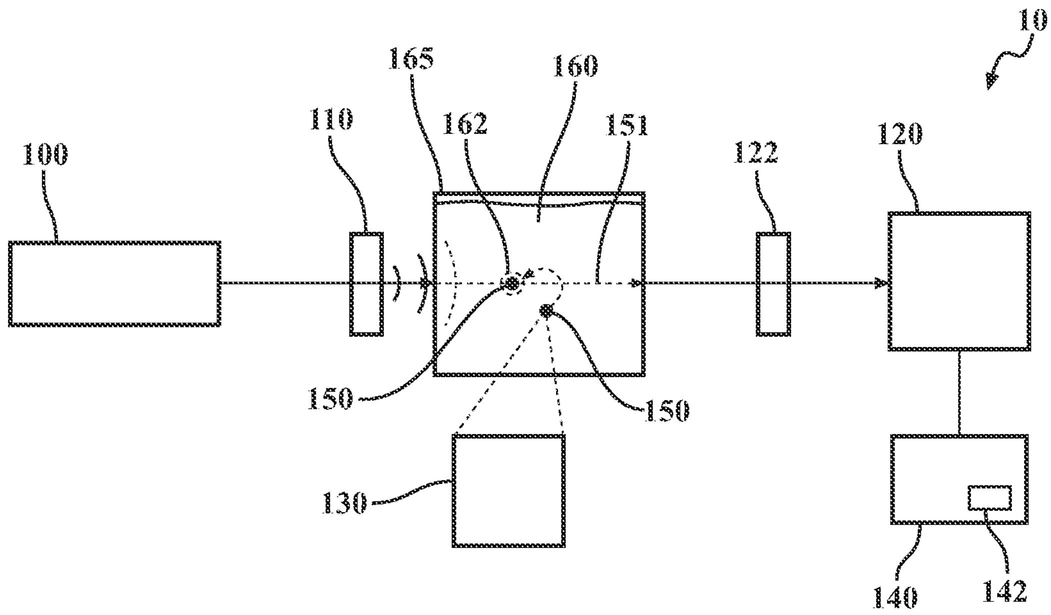
FIG. 1 shows a dynamical liquid sensor according to the teachings of the present disclosure.

It should be noted that the figures set forth herein are intended to exemplify the general characteristics of the chemical compounds, materials, and catalysts among those of the present technology, for the purpose of the description of certain aspects. These figures may not precisely reflect the characteristics of any given aspect and are not necessarily intended to define or limit specific embodiments within the scope of this technology. Further, certain aspects may incorporate features from a combination of figures.

DETAILED DESCRIPTION

The present disclosure provides sensors for determining at least one property of a liquid-based product or material (referred to herein simply as "liquid"). The sensors are dynamical sensors in the form of sensitive quantum sensors, which do not necessarily include a physical probe or electrode disposed or located within a liquid from which measurements are being taken. The sensors can include a defect nanoparticle, a light source configured to optically excite the defect nanoparticle, a radio frequency (RF) source configured to RF excite the defect nanoparticle over a range of RF frequencies, and an optical detector configured to detect an optical signal emitted from the defect nanoparticle in the liquid. In addition, and unlike known quantum sensors, the sensors according to the teachings of the present disclosure include a tweezer source that manipulates (e.g., moves) the defect nanoparticle within the liquid such that the defect nanoparticle is moved and located at a desired position in an enclosure (e.g., a container) containing the liquid such that the light source and the RF source can desirably excite the defect nanoparticle and the optical detector can receive and optically detect a magnetic resonance signal from the excited defect nanoparticle.

As used herein, the phrase "quantum sensor" refers to a sensor that determines a property or state, or a change in a property or state, of a medium surrounding a nanoparticle by detecting a quantum property, or a change in a quantum property, respectively, of an atom defect in the nanoparticle. And as used herein, the phrase "defect nanoparticle" refers to a nanoparticle with an atom size point defect that exhibits photoluminescence when excited with light. Non-limiting examples of defect nanoparticles include nitrogen vacancy (NV) diamond nanoparticles, silicon vacancy (SiV) diamond nanoparticles, NV hexagonal born nitride (hBN) nanoparticles, and SiV hBN nanoparticles.

The medium surrounding the defect nanoparticle in the present disclosure is a liquid and "a property of the liquid" refers to force (e.g., thermal, magnetic, electrical) imposed on the liquid. For example, and as used herein, a property of liquid can include a temperature of a liquid, a magnetic field within the liquid, an electric field within the liquid, and a heat capacity of a liquid, among others.

The present disclosure also provides methods for determining one or more properties of a liquid. The methods include manipulating a defect nanoparticle in a liquid with a tweezer source such that the defect nanoparticle is located or positioned at a desired position in an enclosure containing the liquid, and exciting the defect nanoparticle with light and a range of RF frequencies such that the defect nanoparticle emits an optical signal (e.g., an optically detectable magnetic resonance signal) as a function of the RF frequencies and a property of the liquid. The optical signal is detected with an optical detector and a controller determines the property of the liquid as a function of the detected optical signal. In some variations, the controller calculates the property of the liquid using one or more equations, while in the other variations the controller determines the property of the liquid using one or more look-up tables.

Referring now to FIG. 1, a sensor 10 according to the teachings of the present disclosure is shown. The sensor 10 includes a light source 100, an RF excitation source 110 (also referred to herein simply as "RF source"), an optical detector 120, and a tweezer source 130. In some variations, the RF source 110 is a microwave excitation source and the optical detector 120 is a photocurrent detector. Non-limiting examples of the tweezer source 130 include an acoustic tweezer source, an optical tweezer source, an optoelectronic tweezer source, a plasmonic tweezer source, an electrokinetic tweezer source, and a hydrodynamic tweezer source. In at least one variation, the sensor 10 includes an optical lens 122 and/or a controller 140 with optional memory 142. And in at least one variation, the sensor 10 includes one or more defect nanoparticles 150.

During operation of the sensor 10, the one or more defect nanoparticles 150 are disposed in a liquid 160 that is surrounded or contained by an enclosure 165, and the tweezer source 130 manipulates (e.g., moves) at least one defect nanoparticle 150 to a desired position 162 within the enclosure 165. The light source 100 optically excites the defect nanoparticle 150 at the desired position 162 such that an optical signal 151 (e.g., a photoluminescence signal) is emitted thereby, focused by the optical lens 122, and detected by the optical detector 120. In some variations, the light source 100 optically excites the defect nanoparticle 150 while RF radiation (e.g., microwave radiation) propagating from the RF source 110 interacts with the defect nanoparticle 150. For example, in at least one variation the RF source 110 emits a range of RF frequencies (e.g., a range of microwave frequencies) that interact with the defect nanoparticle 150 and the optical signal emitted by the defect nanoparticle 150 is a function of the range of RF frequencies. And while FIG. 1 illustrates a single desired position 162, in some variations the tweezer source 130 manipulates one or more defect nanoparticles 150 to more than one desired position 162 such that one or more properties of the liquid 160 at different locations within the enclosure 165 is/are measured.

In variations where the tweezer source 130 is an acoustic tweezer source, the tweezer source 130 manipulates the one or more defect nanoparticles 150 in the liquid 160 using sound waves. Not being bound by theory, a defect nanoparticle 150 in a standing acoustic field is subjected to an acoustic-radiation force that moves the defect nanoparticle 150 to specific regions of the standing acoustic field. And depending on the properties of the liquid 160, such as density and compressibility, the defect nanoparticle 150 can be induced to move to either acoustic pressure nodes (minimum pressure regions) or pressure antinodes (maximum pressure regions). And by controlling the position of acoustic pressure nodes or antinodes, the precise movement of the defect nanoparticle 150 using sound waves from the tweezer source 130 is provided.

In variations where the tweezer source 130 is an optoelectronic tweezer source, the tweezer source 130 manipulates the one or more defect nanoparticles 150 in the liquid 160 using a focused laser beam. Not being bound by theory, the focused laser beam provides an attractive or repulsive force on the defect nanoparticle 150 depending on the relative refractive index between the defect nanoparticle 150 and the liquid 160. And by controlling the attractive or repulsive force on the defect nanoparticle 150, the precise movement of the defect nanoparticle 150 is provided.

In variations where the tweezer source 130 is an optoelectronic tweezer source, the tweezer source 130 manipulates the one or more nanodefect particles 150 in the liquid 160 using light-induced dielectrophoresis (i.e., a light induced force exerted on a dielectric particle when subjected to a non-uniform electric field). Not being bound by theory, a photosensitive device layer forms "virtual electrodes" upon exposure to light, creating non uniformities in an applied electric field. The non-uniform electric field gives rise to dielectrophoresis such that micro- and nanoparticles move as a result of the non-uniformities in the electric field imparting unequal forces on the induced dipole of the particle. And by controlling the dielectrophoresis force on the defect nanoparticle 150, the precise movement of the defect nanoparticle 150 is provided.

In variations where the tweezer source 130 is a plasmonic tweezer source, the tweezer source 130 manipulates the one or more defect nanoparticles 150 in the liquid 160 using surface plasmons. Not being bound by theory, the surface plasmons are a collective oscillation of the electron plasma that exists at the interface between a metal and a dielectric medium under an external electromagnetic field, and the real part of the dielectric function changes sign across the interface. Also, the change in sign of the real part of the dielectric function enables light to be confined into a subwavelength region by storing optical energy within electron oscillations such that control of light-matter interactions at the nanoscale is possible. In addition, incident light is confined into a region smaller than the light wavelength owing to the difference in the permittivity of the metal and the permittivity of the surroundings, which in turn enhances the electric field and strengthens the optical force for trapping and manipulating the defect nanoparticles 150 such that precise movement of the defect nanoparticle 150 is provided.

In variations where the tweezer source 130 is a hydrodynamic tweezer source, the tweezer source 130 manipulates the one or more defect nanoparticles 150 in the liquid 160 using a steady streaming flow of the liquid 160. Not being bound by theory, a key trait of steady streaming flow in a microchannel is the rectilinear flow deviation in the vicinity of an obstruction. In addition, the flow deviation near the obstruction is used to trap small objects such that precise movement of the defect nanoparticle 150 is provided.

Figure 2:
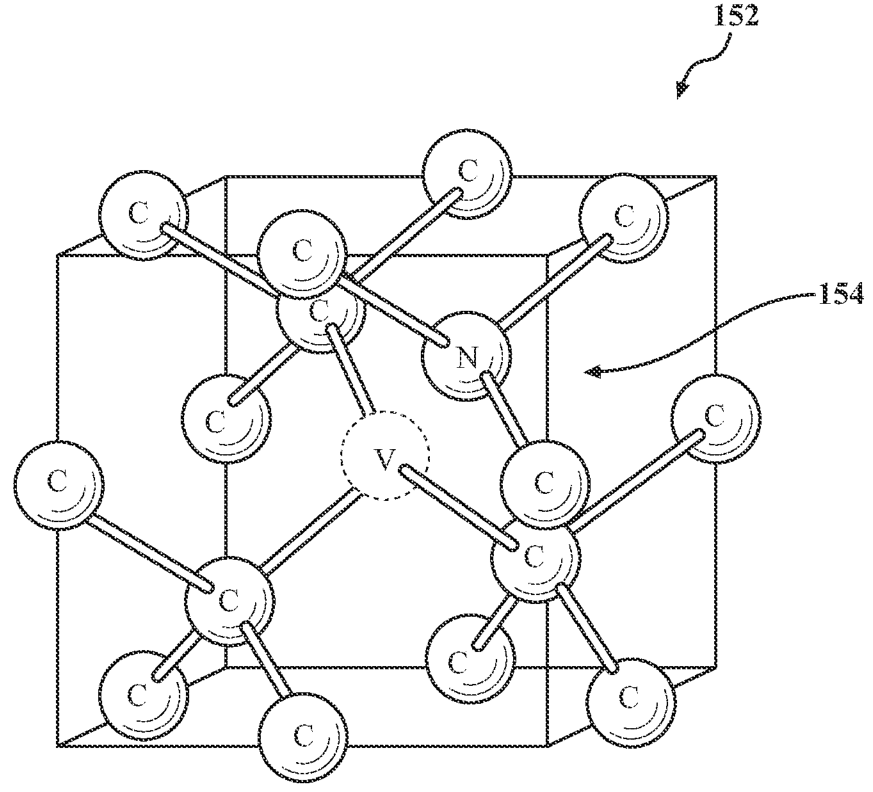
FIG. 2 illustrates a crystal structure for a nitrogen vacancy (NV) in diamond.

In some variations, the one or more defect nanoparticles 150 include nitrogen vacancy (NV) diamond nanoparticles with a crystallographic model 152 of such an NV diamond nanoparticle shown in FIG. 2. Not being bound by theory, an NV center 154 in a NV diamond nanoparticle includes a substitutional nitrogen (N) atom in a lattice site adjacent a carbon vacancy (V). Also, the NV center 154 may have four orientations, each corresponding to a different crystallographic orientation of the diamond lattice.

The NV center 154 has a number of electrons (not shown), including three unpaired electrons, each one from the vacancy V and a carbon (C) atom adjacent to the vacancy V. and a pair of electrons between the nitrogen N and the vacancy V. The NV center 154, which is in the negatively charged state, also includes an extra electron.

Figure 3:
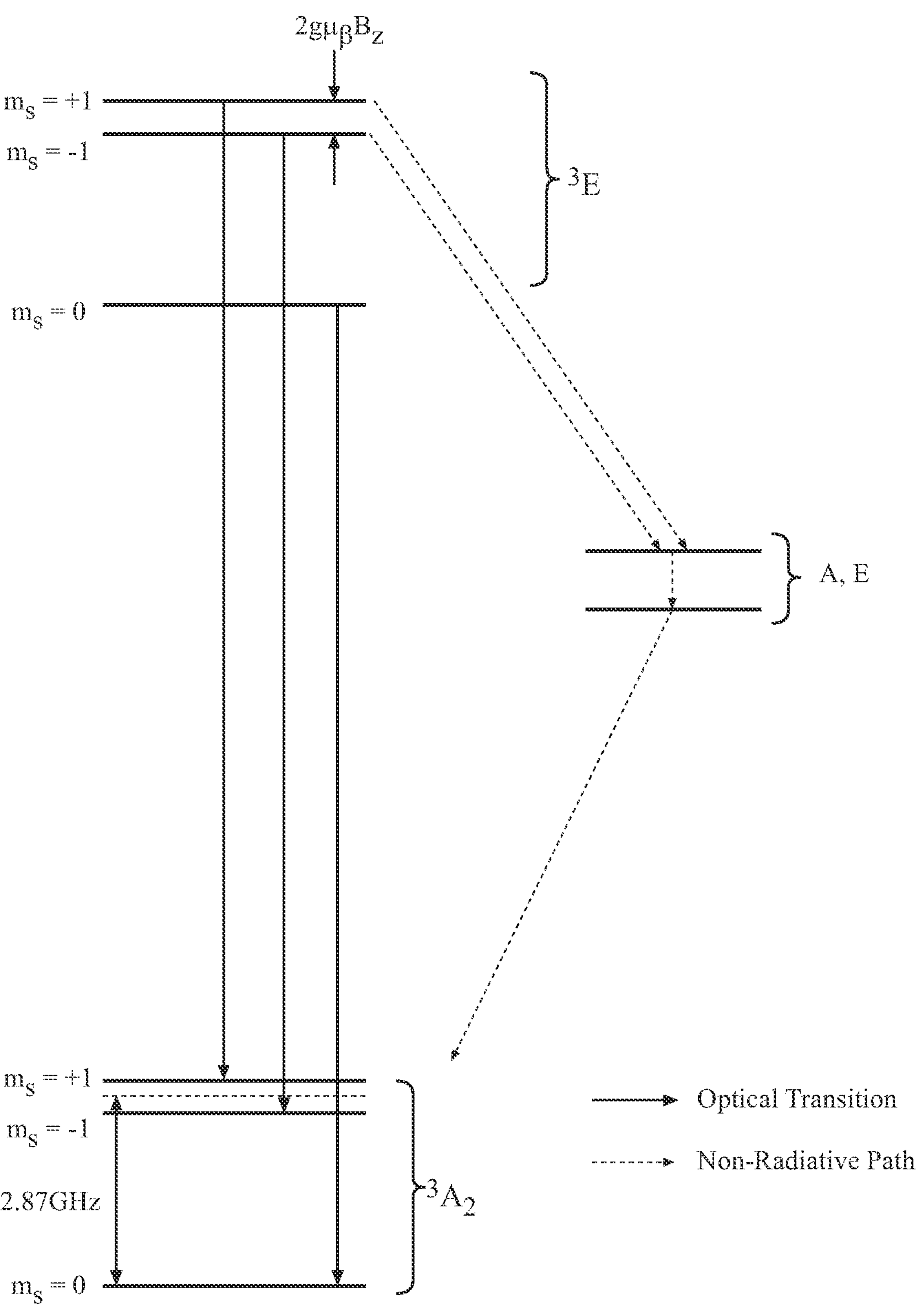
FIG. 3 is an energy level diagram showing energy levels of spin states for a NV in diamond.

Referring to FIG. 3 taken from U.S. Pat. No. 9,829,545 B2 which is incorporated herein by reference, the NV center 154 has rotational symmetry, a ground state, which is a spin triplet with $^3A_2$ symmetry with one spin state $m_s=0$, and two further spin states $m_s=\pm1$, and $m_s=-1$. In the absence of an external magnetic field, the $m_s=\pm1$ energy levels are offset from the $m_s=0$ due to spin-spin interactions, and the $m_s=\pm1$ energy levels are degenerate, i.e., they have the same energy. The $m_s=0$ spin state energy level is split from the $m_s=\pm1$ energy levels by an energy of 2.87 GHz for a zero external magnetic field. Introducing an external magnetic field with a component along the NV axis lifts the degeneracy of the $m_s=\pm1$ energy levels, splitting the energy levels $m_s=\pm1$ by an amount $2g\mu_\beta B_z$, where g is the g-factor, $\mu_\beta$ is the Bohr magneton, and $B_z$ is the component of the external magnetic field along the NV axis.

The NV center electronic structure further includes an excited triplet state $^3E$ with corresponding $m_s=0$ and $m_s=+1$ spin states. The optical transitions between the ground state $^3A_2$ and the excited triplet $^3E$ are predominantly spin conserving, i.e., the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

An alternative non-radiative decay route from the triplet $^3E$ to the ground state $^3A_2$ via intermediate electron states are intermediate singlet states A, E with intermediate energy levels. Also, the transition rate from the $m_s=\pm1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=+1$ spins states and the decay from the excited triplet $^3E$ state via the intermediate singlet states A, E to the ground state triplet $^3A_2$ allows optical excitation to pump the NV center into the $m_s=0$ spin state of the ground state $^3A_2$. In this manner, the population of the $m_s=0$ spin state of the ground state $^3A_2$ may be "reset" to a maximum polarization determined by the decay rates from the triplet $^3E$ to the intermediate singlet states.

The decay in the form of fluorescence intensity due to optically stimulating the excited triplet $^3E$ state is less for the $m_s=\pm1$ states than for the $m_s=0$ spin state since the decay via the intermediate states does not result in a photon emitted in the fluorescence band, and the greater probability that the $m_s=\pm1$ states of the excited triplet $^3E$ state will decay via the non-radiative decay path. The lower fluorescence intensity for the $m_s=\pm1$ states than for the $m_s=0$ spin state allows the fluorescence intensity to be used to determine the spin state. Also, as the population of the $m_s=\pm1$ states increases relative to the $m_s=0$ spin, the overall fluorescence intensity will be reduced.

Figure 4:
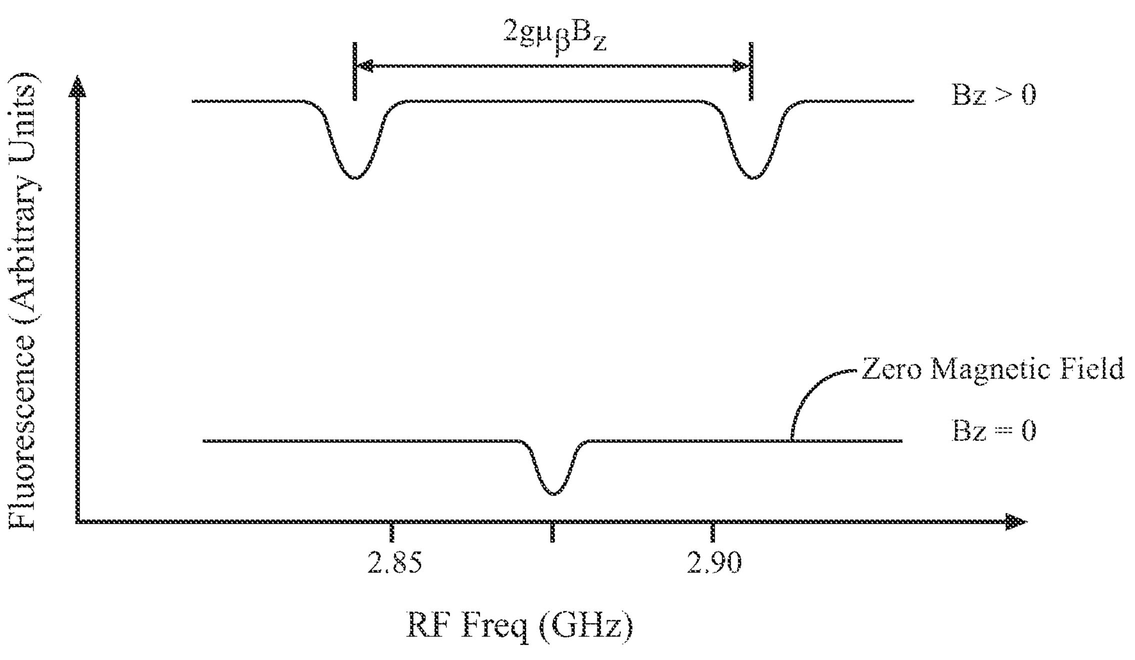
FIG. 4 is a graphical plot of an optically detected magnetic resonance signal for a NV in diamond in a zero magnetic field and a non-zero magnetic field.

Referring to FIG. 4, again taken from U.S. Pat. No. 9,829,545 B2, a plot of fluorescence as a function of RF frequency emitted from excited NV diamond aligned along a single direction and subjected to different magnetic field components $B_z$ along the NV axis is shown. And as shown in FIG. 4, the energy splitting between the $m_s=-1$ spin state and the $m_s=+1$ spin state increases with increasing $B_z$. Accordingly, the component $B_z$ can be determined and it should be understood that the presence and magnitude of a magnetic field in a liquid (e.g., liquid 160) with a NV diamond nanoparticle 150 disposed therein can be determined with the sensor 10 and the tweezer source 130 that manipulates the NV diamond nanoparticle 150 to a desired position within an enclosure (e.g., desired position 162 within the enclosure 165 that contains the liquid 160).

Figure 5:
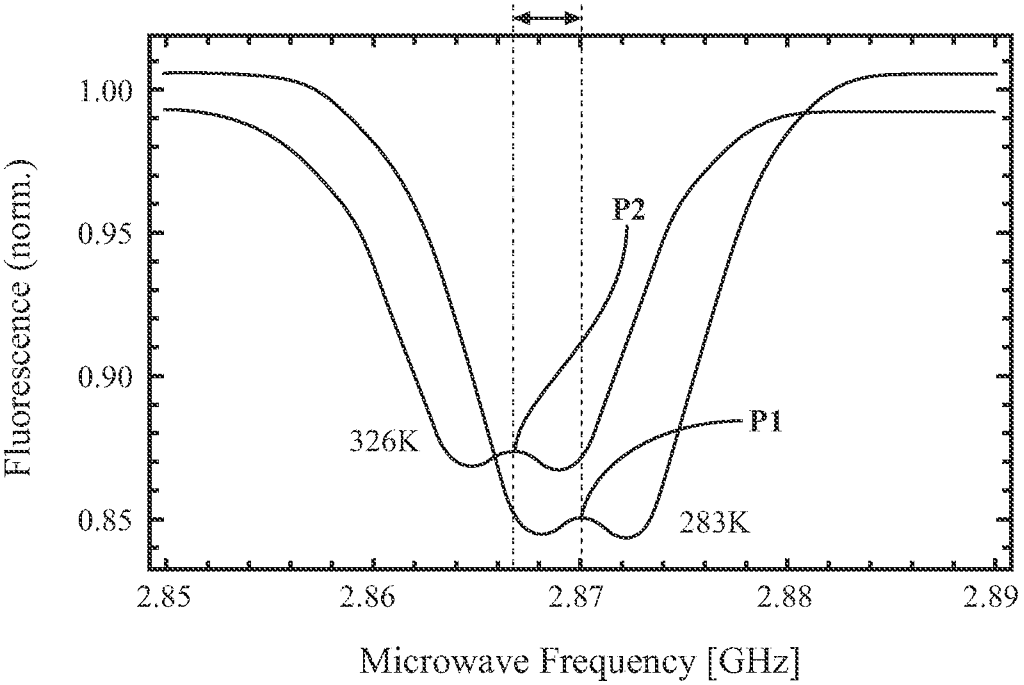
FIG. 5 is a graphical plot of an optically detected magnetic resonance signal for a NV in diamond at two different temperatures.

Referring to FIG. 5 taken from reference titled "Temperature dependence of the nitrogen-vacancy magnetic resonance in diamond" Acost et al., Phys. Rev. Lett. 106, 209901 (2011), which is incorporated herein by reference, a graphical plot of fluorescence intensity as a function of RF frequency for a NV diamond nanoparticle at two different temperatures is shown. Particularly, fluorescence intensities of a NV diamond nanoparticle excited with light and RF frequencies between 2.85 and 2.89 GHz, and at the temperatures 283 K and 326 K are shown. And as shown in the figure, each of the plots or scans of fluorescent intensity exhibit a central peak (labeled P1 and P2), the central peak shifts toward a lower RF frequency at 326 K compared to 283 K, and the shift in central peaks generally obeys the expression:

$$\Delta T(\mathrm{K}) = \frac{\Delta f(\mathrm{kHz})}{-76(\mathrm{kHz/K})} \qquad \text{Eq. 1}$$

where ΔT is the shift in temperature in Kelvin (K) and Δf in kilo frequency (kHz) is the shift in frequency between the central peaks P1 and P2. Accordingly, the temperature of a liquid (e.g., liquid 160) with a NV diamond nanoparticle 150 can be determined with the sensor 10 that uses the tweezer source 130 to manipulate the NV diamond nanoparticle 150 to desired position within an enclosure (e.g., desired position 162 within the enclosure 165 that contains the liquid 160).

Regarding electric fields and their impact on defect nanoparticles 150, an expression for the electric field ($\vec{E}^{ND}$) induced inside a NV diamond nanoparticle can be:

$$\vec{E}^{ND} = \frac{q}{4\pi\epsilon_0}\frac{3}{2\epsilon_e + \epsilon_{ND}}\frac{\vec{b}}{b^3} \qquad \text{Eq. 2}$$

where q is a single charge at position $\vec{b}$, $\in_0$ is the permittivity of a vacuum, $\in_e$ is the permittivity of the liquid (e.g., an electrolyte), and $\in_{ND}$ is the permittivity of the diamond nanoparticle as described in the reference titled "Quantum sensing of electric field distributions of liquid electrolytes with NV-centers in nanodiamonds" by Hollendonner et al. found at https://iopscience.iop.org/article/10.1088/1367-2630/acf392, which is incorporated herein by reference. And as disclosed in the Hollendonner et al., NV diamond nanoparticles can be used to sense and measure electric fields. Accordingly, an electric field in a liquid (e.g., liquid 160) with a NV diamond nanoparticle 150 can be determined with the sensor 10 that uses the tweezer source 130 to manipulate the NV diamond nanoparticle 150 to desired position within an enclosure (e.g., desired position 162 within the enclosure 165 that contains the liquid 160).

Figure 6:
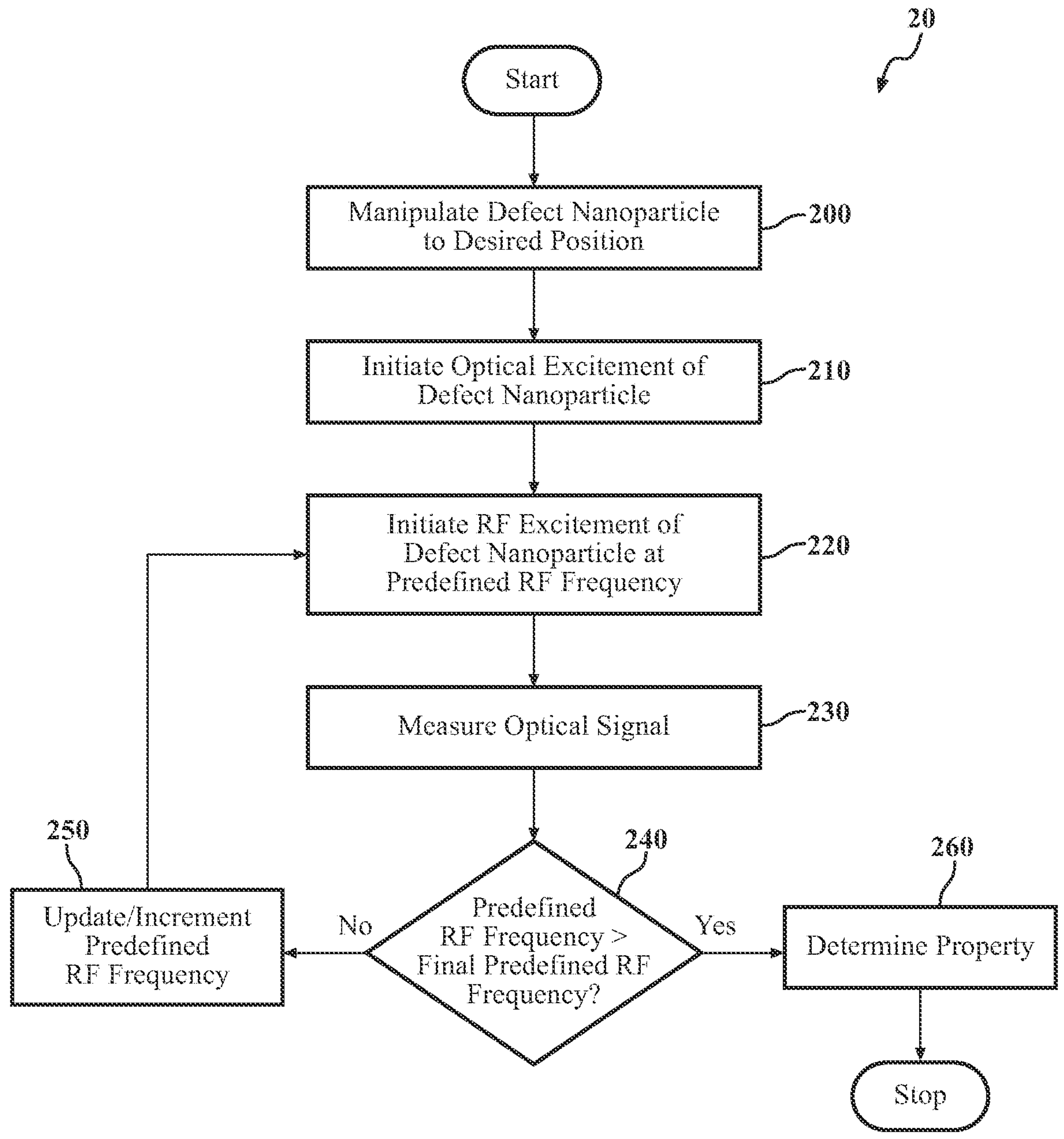
FIG. 6 is a flow chart for a method of using the sensor in FIG. 1 according to the teachings of the present disclosure.

Referring to FIG. 6, a method 20 for determining a property of a liquid using the sensor 10 is shown. The method 20 includes manipulating a defect nanoparticle 150 with the tweezer source 130 into the desired position 162 within the enclosure 165 at 200, and initiating optical excitement of the defect nanoparticle 150 with the light source 100 at 210. The RF source 110 initiates RF excitement of the defect nanoparticle 150 with a predefined RF frequency at 220, and an optical signal from the optically and RF excited defect nanoparticle 150 (e.g., the optical signal intensity) is measured with the optical detector 120 at 230. The method 20 includes determining if the predefined RF frequency in step 220 is greater than a final predefined RF frequency at 240, and if the predefined RF frequency in step 220 is not greater than the final predefined RF frequency, the method 20 updates and/or increments the predefined RF frequency at 250 and returns to 220 where the defect nanoparticle 150 is RF excited with the updated/increment RF signal. This cycle, i.e., 220-230-240-250-220, continues until the predefined RF frequency is greater than the predefined final RF frequency. And when the predefined RF frequency is greater than the predefined final RF frequency at 240, the method 20 determines a predefined property of the liquid 160 at 260. In some variations, the controller 140 calculates a value for the predefined property using one or more equations stored in the memory 142. In the alternative, or in addition to, the controller 140 determines a value for the predefined property from a look-up table stored in the memory 142. In this manner, the sensor 10 and/or method 20 measure an optical signal from the optically and RF excited defect nanoparticle 150 as a function of a property of the liquid 160.

The preceding description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "include", "includes", and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The flowcharts and block diagrams in the figures illustrate the architecture, functionality, and operation of possible implementations of systems, methods, and computer program products according to various embodiments. In this regard, a block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The sensors, systems, components, controllers, and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a ROM, an EPROM or flash memory, a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain or store a program for use by or in connection with an instruction execution system, apparatus, or device.

The broad teachings of the present disclosure can be implemented in a variety of forms and variations. Therefore, while this disclosure includes particular examples, the true scope of the disclosure should not be so limited since other modifications will become apparent to the skilled practitioner upon a study of the specification and the following claims. Reference herein to one form or variation, or various forms or variations means that a particular feature, structure, or characteristic described in connection with a form, variation, or particular system is included in at least one form or variation. The appearances of the phrase "in one form" (or variations thereof) are not necessarily referring to the same form.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

The invention claimed is:

1. A sensor comprising:
- an enclosure containing a liquid;
- at least one defect nanoparticle disposed and moveable within the liquid;
- a tweezer source configured to manipulate and move the at least one defect nanoparticle in the liquid to a desired position in the enclosure;
- a light source configured to optically excite the defect nanoparticle in the liquid when moved to the desired position by the tweezer source;
- a radio frequency (RF) excitation source configured to RF excite the defect nanoparticle in the liquid when moved to the desired position by the tweezer source; and
- an optical detector configured to receive an optical signal emitted from the optically excited defect nanoparticle.

2. The sensor according to claim 1, wherein the RF excitation source is a microwave excitation source.

3. The sensor according to claim 2, wherein the microwave excitation source is configured to excite the defect nanoparticle with a range of microwave frequencies.

4. The sensor according to claim 3, wherein the optical detector is configured to detect the optical signal as a function of the range of microwave frequencies.

5. The sensor according to claim 4, wherein the optical signal emitted from the optically excited defect nanoparticle is a photoluminescence signal.

6. The sensor according to claim 1, wherein the tweezer source is selected from the group consisting of an acoustic tweezer source, an optoelectronic tweezer source, a plasmonic tweezer source, an electrokinetic tweezer source, and a hydrodynamic tweezer source.

7. The sensor according to claim 1, wherein the defect nanoparticle is selected from the group consisting of a nitrogen vacancy diamond nanoparticle, a silicon vacancy diamond nanoparticle, a nitrogen vacancy hexagonal boron nitride nanoparticle, and a silicon vacancy hexagonal boron nitride nanoparticle.

8. The sensor according to claim 1 further comprising a controller configured to receive a signal from the optical detector and calculate a property of the liquid.

9. The sensor according to claim 8, wherein the signal is an optically detected magnetic resonance signal.

10. The sensor according to claim 8, wherein the signal is a photocurrent detected magnetic resonance signal.

11. The sensor according to claim 8, wherein the property is selected from the group consisting of a temperature of the liquid, a magnetic field in the liquid, and an electric field in the liquid.

12. The sensor according to claim 1, wherein the tweezer source is configured to manipulate and move the at least one defect nanoparticle to at least two different desired positions within the liquid contained in the enclosure.

13. A sensor comprising:
- an enclosure containing a liquid and at least one defect nanoparticle disposed and moveable within the liquid;
- a tweezer source configured to manipulate and move a defect nanoparticle in the liquid to a desired position in the enclosure;
- a light source configured to optically excite the defect nanoparticle in the liquid when moved to the desired position by the tweezer source;
- a radio frequency (RF) excitation source configured to RF excite the defect nanoparticle in the liquid at a range of RF frequencies when moved to the desired position by the tweezer source;
- an optical detector configured to receive an optical signal emitted from the optically excited defect nanoparticle; and
- a controller configured to determine a property of the liquid as a function of the optical signal.

14. The sensor according to claim 13, wherein the tweezer source is selected from the group consisting of an acoustic tweezer source, an optoelectronic tweezer source, a plasmonic tweezer source, an electrokinetic tweezer source, and a hydrodynamic tweezer source.

15. The sensor according to claim 14, wherein the defect nanoparticle is selected from the group consisting of a nitrogen vacancy diamond nanoparticle, a silicon vacancy diamond nanoparticle, a nitrogen vacancy hexagonal boron nitride nanoparticle, and a silicon vacancy hexagonal boron nitride nanoparticle.

16. The sensor according to claim 15, wherein the optical signal is selected from the group consisting of an optically detected magnetic resonance signal and a photocurrent detected magnetic resonance signal.

17. A method comprising:
- manipulating and moving a defect nanoparticle in a liquid with a tweezer source such that the defect nanoparticle is located at a desired position in an enclosure containing the liquid;
- optically exciting, with a light source, the defect nanoparticle in the liquid at the desired position;
- radio frequency (RF) exciting, with an RF source, the defect nanoparticle in the liquid at the desired position with a range of RF frequencies;
- detecting an optical signal, with an optical detector, from the optically excited defect nanoparticle as a function of the range of RF frequencies; and
- determining, with a controller, a property of the liquid as a function of the detected optical signal.

18. The method according to claim 17, wherein the tweezer source is selected from the group consisting of an acoustic tweezer source, an optoelectronic tweezer source, a plasmonic tweezer source, an electrokinetic tweezer source, and a hydrodynamic tweezer source.

19. The method according to claim 18, wherein the defect nanoparticle is selected from the group consisting of a nitrogen vacancy diamond nanoparticle, a silicon vacancy diamond nanoparticle, a nitrogen vacancy hexagonal boron nitride nanoparticle, and a silicon vacancy hexagonal boron nitride nanoparticle.

20. The method according to claim 19, wherein the optical signal is selected from the group consisting of an optically detected magnetic resonance signal and a photocurrent detected magnetic resonance signal.

* * * * *